United States Patent
Carlson et al.

(10) Patent No.: US 9,942,990 B2
(45) Date of Patent: Apr. 10, 2018

(54) INSERTION LOSS REDUCTION AND INCREASED BONDING IN A CIRCUIT APPARATUS

(71) Applicant: International Business Machines Corporation, Armonk, NY (US)

(72) Inventors: Brian L. Carlson, Rochester, MN (US); John R. Dangler, Rochester, MN (US); Roger S. Krabbenhoft, Rochester, MN (US); Kevin A. Splittstoesser, Stewartville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/245,361

(22) Filed: Aug. 24, 2016

(65) Prior Publication Data

US 2017/0079133 A1    Mar. 16, 2017

Related U.S. Application Data

(62) Division of application No. 14/855,635, filed on Sep. 16, 2015, now Pat. No. 9,648,723.

(51) Int. Cl.
*H05K 3/02*  (2006.01)
*H05K 3/26*  (2006.01)
(Continued)

(52) U.S. Cl.
CPC ............. *H05K 3/26* (2013.01); *H01P 3/02* (2013.01); *H05K 1/0237* (2013.01);
(Continued)

(58) Field of Classification Search
CPC ... H01L 27/3276; H01L 51/0097; H05K 3/06; H05K 1/0393; H05K 1/09;
(Continued)

(56) References Cited

U.S. PATENT DOCUMENTS 4,952,275 A    8/1990  Lin et al.
5,007,993 A *  4/1991  Hull ..................... C25D 21/12
                                                   204/229.5
(Continued)

FOREIGN PATENT DOCUMENTS

WO    2004054332    6/2004

OTHER PUBLICATIONS

Reducing signal transmission loss by low surface roughness, Takaaki Okubo, Jan. 28, 2014.
(Continued)

*Primary Examiner* — Thiem Phan
(74) *Attorney, Agent, or Firm* — Matthew C. Zehrer

(57) ABSTRACT

A circuit apparatuses include at least one circuit feature formed from patterning a conductive sheet. The conductive sheet includes an irregular surface and a planarized surface. Conductive sheet roughness is minimized in first regions of the circuit apparatus and is maintained in second regions of the circuit apparatus. Selectively planarizing portions of the conductive sheet allows for the utilization of lower cost rougher conductive sheets. The planarized surface allows for increased signal integrity and reduced insertion loss and the irregular surface allows for increased adhesion and enhancing reliability of the circuit apparatus.

8 Claims, 4 Drawing Sheets

(51) Int. Cl.
*H01P 3/02* (2006.01)
*H05K 1/02* (2006.01)
*H05K 1/11* (2006.01)
*H05K 1/18* (2006.01)
*H05K 3/46* (2006.01)
*H05K 1/09* (2006.01)
*H05K 3/38* (2006.01)
*H05K 3/06* (2006.01)
*H05K 1/03* (2006.01)

(52) U.S. Cl.
CPC ......... *H05K 1/0242* (2013.01); *H05K 1/0298* (2013.01); *H05K 1/09* (2013.01); *H05K 1/115* (2013.01); *H05K 1/181* (2013.01); *H05K 3/064* (2013.01); *H05K 3/382* (2013.01); *H05K 3/46* (2013.01); *H05K 1/0393* (2013.01); *H05K 1/111* (2013.01); *H05K 3/06* (2013.01); *H05K 3/4611* (2013.01); *H05K 2201/0355* (2013.01); *H05K 2201/0391* (2013.01); *Y10T 29/49117* (2015.01); *Y10T 29/49124* (2015.01); *Y10T 29/49155* (2015.01); *Y10T 29/49156* (2015.01)

(58) Field of Classification Search
CPC ......... Y10T 29/49117; Y10T 29/49124; Y10T 29/49155; Y10T 29/49156
USPC ........................... 29/847, 825, 829, 830, 846
See application file for complete search history.

(56) References Cited

U.S. PATENT DOCUMENTS

| | | |
|---|---|---|
| 6,939,620 B2 | 9/2005 | Nagai |
| 7,356,917 B2 | 4/2008 | Harada |
| 7,501,051 B2 | 3/2009 | Shieh et al. |
| 7,981,561 B2 | 7/2011 | Rakowski et al. |
| 8,123,927 B1 | 2/2012 | Sheffield |
| 8,357,287 B2 | 1/2013 | Clasquin |
| 9,145,619 B2 * | 9/2015 | Andreacchi ............... C25F 3/16 |
| 2003/0006063 A1 | 9/2003 | Otsuka |
| 2005/0224368 A1 | 10/2005 | Sato |
| 2010/0000771 A1 | 1/2010 | Shimauchi |

OTHER PUBLICATIONS

Surface Finish Effects on High-Speed Signal Degradation Xin Wu, Member, IEEE, Don Cullen, Feb. 2008.
List of IBM Patents or Patent Applications Treated as Related, Aug. 24, 2016.

* cited by examiner

US 9,942,990 B2

INSERTION LOSS REDUCTION AND INCREASED BONDING IN A CIRCUIT APPARATUS

CROSS REFERENCE TO RELATED DOCUMENT

This application is a Division of U.S. application Ser. No. 14/855,635, filed on Sep. 16, 2015, now U.S. Pat. No. 9,648,723.

FIELD OF THE INVENTION

Embodiments of the invention generally relate to electronic systems and more particularly to circuit apparatuses, such as printed circuit boards, flex circuits, etc. which include at least one circuit feature including an irregular surface and/or a planarized surface. The planarized surface reduces insertion losses and the irregular surface increases bonding within the circuit apparatus.

DESCRIPTION OF THE RELATED ART

A printed circuit board (PCB) mechanically supports and electrically connects electronic components using conductive traces etched from conductive sheets laminated onto a non-conductive laminate. PCBs can be single sided (one copper layer), double sided (two copper layers) or multi-layer (outer and inner layers). Multi-layer PCBs allow for much higher component density. Conductive traces on different layers are connected with plated-through holes called vias.

If the laminate is formed from flexible materials, such as polyimide, polyether ether ketone, transparent conductive polyester, etc. a flexible circuit apparatus, or flex circuit is formed. A flexible laminate allows the flex circuit to conform to a desired shape, or to flex during its use.

SUMMARY

In an embodiment of the present invention, a process of fabricating a flex circuit includes attaching a conductive sheet to a first flexible insulator, the conductive sheet comprising an irregular surface opposed to the first flexible insulator, forming a mask upon a protected portion of the irregular surface, planarizing an unprotected portion of the irregular surface uncovered by the mask, and subsequent to planarizing the unprotected portion, and patterning the conductive sheet into at least one circuit feature which includes a maintained irregular surface and a planarized surface.

In another embodiment of the present invention, a flexible circuit apparatus includes a first flexible insulator, a high speed signal trace upon the first flexible insulator, and a low speed signal trace upon the first flexible insulator. The high speed signal trace includes a planarized surface and the low speed signal trace includes an irregular surface.

These and other embodiments, features, aspects, and advantages will become better understood with reference to the following description, appended claims, and accompanying drawings.

DETAILED DESCRIPTION

Embodiments of the invention relate to a circuit apparatuses include at least one circuit feature formed from patterning a conductive sheet. The conductive sheet includes an irregular surface and a planarized surface. Conductive sheet roughness is minimized in first regions of the circuit apparatus and is maintained in second regions of the circuit apparatus. Selectively planarizing portions of the conductive sheet allows for the utilization of lower cost rougher conductive sheets. The planarized surface allows for increased signal integrity and reduced insertion loss and the irregular surface allows for increased adhesion and enhancing reliability of the circuit apparatus.

The circuit apparatus may be a PCB which mechanically supports and electrically connects electronic components using conductive traces etched from the conductive sheets. The circuit apparatus may also be a flex circuit, or the like, if the laminate is formed from flexible materials, such as polyimide, polyether ether ketone, transparent conductive polyester, etc. A flexible laminate allows the flex circuit to conform to a desired shape, or to flex during its use.

As a result of one or more embodiments, insertion loss of the circuit apparatus may be reduced. Insertion loss is the loss of signal power resulting from the insertion of a device to the conductive trace. As electronic system bus speeds increase, overall channel insertion losses become a major factor in observed electronic system performance. The insertion loss driven by the transmission line can be separated into three constituent parts: dielectric losses, resistive losses, and radiative losses. The conductive sheets, conductive trace design, and PCB fabricator's adhesion technique to promote bonding between layers, essentially dictate the resistive losses incurred during electronic system operation.

The resistivity of the conductive sheets typically do not vary with frequency. However, the impact of the conductive sheet roughness on the insertion loss is a frequency dependent parameter due to the thinning of the conductive sheet material in rough regions through which the signal propagates as frequency increases. Therefore, as electronic system bus speeds increase over time, conductive sheet roughness becomes a more important factor to control. Currently, it is common to address the conductive sheet roughness issue through the use of ultra-smooth conductive sheet types. These ultra-smooth conductive sheets are typically more expensive than more standard conductive sheets (which are rougher), and drive reliability issues due to relatively poorer adhesion to the adhesive material used to bond multiple layers together. As a result of the selective roughness reduction techniques disclosed herein, insertion losses may be reduced utilizing rough conductive sheets with selective roughness reduction in the fabrication of circuit apparatus.

Figure 1:
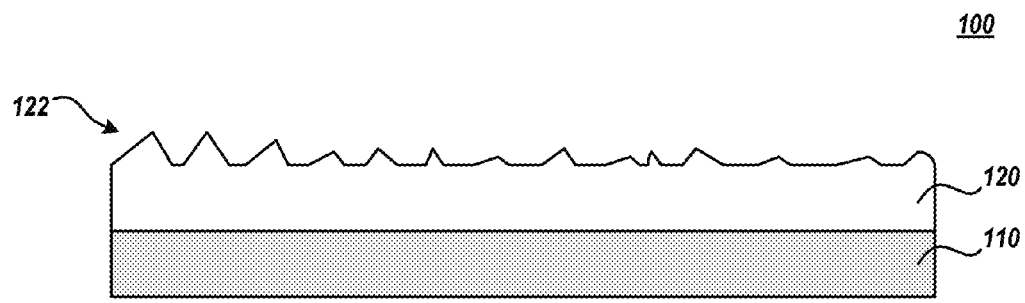
FIG. 1-FIG. 4 illustrate cross sectional views of an exemplary circuit apparatus at an intermediate fabrication stages, according to various embodiments of the invention.

Referring to the Drawings, wherein like numbers denote like parts throughout the several views, FIG. 1 depicts a cross sectional view of circuit apparatus 100 at an initial fabrication stage.

Circuit apparatus 100 may be a PCB, flex circuit, or the like. Circuit apparatus 100 may also be referred to as a printed circuit assembly (PCA), printed circuit board assembly or PCB assembly (PCBA), circuit card assembly (CCA), backplane assembly, flexible circuit, flexible printed circuit board, flex print, flexi-circuit, etc.

Circuit apparatus 100 includes an insulator 110 and at least one conductive sheet 120. The insulator 110 and conductive sheet 120 combination may be a particular layer of a multi-layered circuit apparatus 100. The insulator 110 and conductive sheet 120 combination may be referred to as a core. In certain embodiments, one conductive sheet is bonded, laminated, or otherwise attached to an upper side of the insulator 110. In other embodiments, one conductive sheet is attached to an upper side of the insulator 110 and another conductive sheet is attached to a lower side of the insulator 110.

Insulator 110 is electrically insulating layer and may be a polymer, laminate, substrate, glass-reinforced epoxy laminate (e.g. G10, FR4, G11, FR5), polyimide, polyether ether ketone, transparent conductive polyester, or the like. Insulator 110 mechanically supports conductive traces formed from the conductive sheet 120. The traces may be power traces that provide electrical power to circuit apparatus 100 or may be signal trances, as is known in the art.

Conductive sheet 120 includes an irregular surface 122. Irregular surface 122 may also be referred to as rough, coarse, jagged, and is generally non-planar. Irregular surface 122 is positioned generally outwardly from the insulator 110. For example, if a lower surface of a first single conductive sheet 120 is laminated to the upper surface of insulator 110, irregular surface 122 is the upper surface of the first conductive sheet 120. Likewise, if an upper surface of a second conductive sheet 120 is laminated to the lower surface of insulator 110, irregular surface 122 is the lower surface of the second conductive sheet 120. Conductive sheet 120 is electrically conductive and may be formed from a metallic material. For example, conductive sheet may be a copper foil.

Irregular surface 122 is beneficial in multi-layered circuit apparatuses 100 since the irregular shape of the irregular surface 122 increases the surface area of the irregular surface 122 relative to a similarly dimensioned smooth or planar sheet. The increased surface area allows for more robust bonding between a bonding adhesive, epoxy, or other bonding material and the irregular surface 122.

Figure 2:
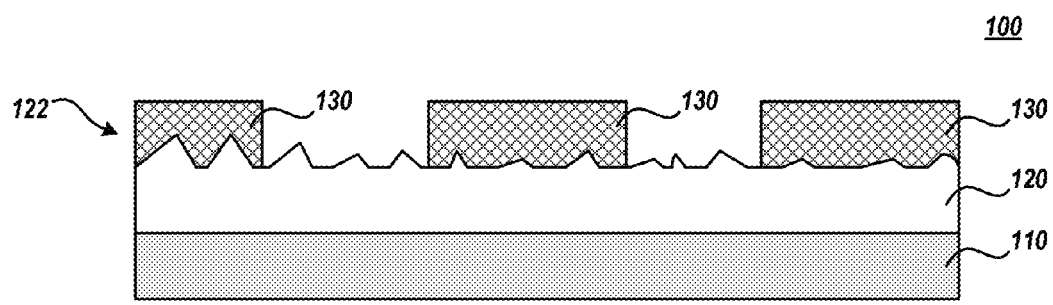

FIG. 2 depicts a cross sectional view of circuit apparatus 100 at an intermediate fabrication stage. At the present fabrication stage, a mask 130 is formed upon the irregular surface 122.

Mask 130 may be formed, deposited, laminated, coated, or otherwise applied upon or to the irregular surface 122. The mask 130 may be formed as a single layer and subsequently patterned to remove a portion of the mask and retain another portion of the mask. The retained portion of mask 130 protects the underlying portion of the irregular surface 122. Alternatively, the mask 130 may be selectively formed upon only those portions of irregular surface 122 that should be protected. The portions of irregular surface 122 that remain uncovered by mask 130 are unprotected and are otherwise exposed. Mask 130 may be formed from a material such as a photoresist, or other known removable masking materials.

Figure 3:
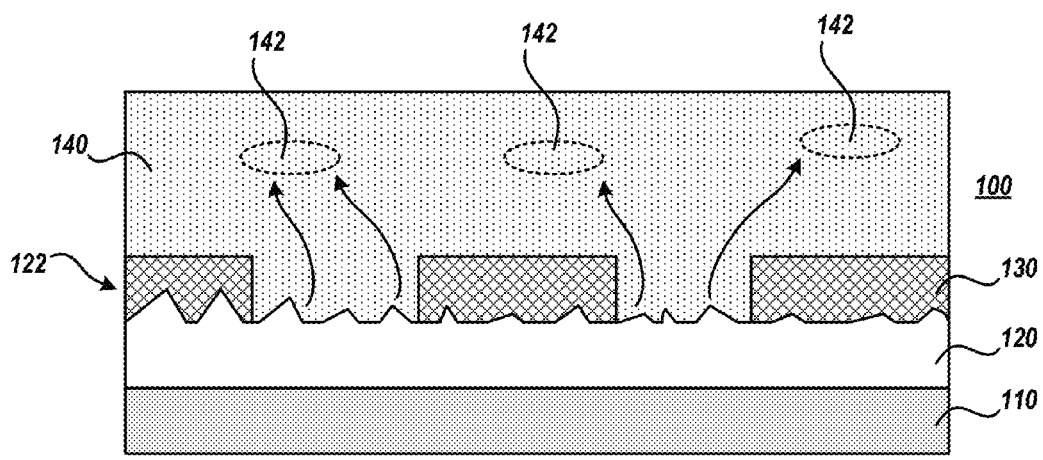

FIG. 3 depicts a cross sectional view of circuit apparatus 100 at an intermediate fabrication stage. At the present fabrication stage, exposed portions of irregular surface 122 are planarized to reduce the geometric irregularity thereof.

The exposed portion of irregular surface 122 may be planarized by a reverse plating electropolishing technique. Electropolishing is an electrochemical process that removes material from the exposed portions of irregular surface 122.

The circuit apparatus may be immersed in a temperature-controlled bath 140 of electrolyte and serves as an anode 142; it is connected to the positive terminal of a DC power supply, the negative terminal being attached to the conductive sheet 120 serving as the cathode. A current passes from the anode 142, where metal on the exposed portions of irregular surface 122 is oxidized and dissolved in the electrolyte. Electrolytes used for electropolishing are most often concentrated acid solutions having a high viscosity, such as mixtures of sulfuric acid and phosphoric acid. Other electropolishing electrolytes include mixtures of perchlorates with acetic anhydride and methanolic solutions of sulfuric acid.

To achieve electropolishing of irregular surface 122, the protruding geometries of irregular surface 122 dissolves faster than the recess geometries. This process, referred to as anodic leveling, is achieved by a mass transport limited dissolution reaction. Anodic dissolution under electropolishing conditions deburrs irregular surface 122 due to increased current density of geometric corners and burrs of irregular surface 122.

The electropolishing of irregular surface 122, provides a less irregular surface to the conductive sheet. That is, the surface area of the electropolished surface of conductive sheet 120 is less than the surface area of the pre polished associated irregular surface 122. In other words, the electropolishing provides a cleaner, smoother, or less rough surface of unprotected portions of conductive sheet 120, improves the surface finish of the unprotected portions of conductive sheet 120 by leveling micro-peaks and valleys, removes a small amount of conductive sheet 120 material from the irregular surface 122 of the unprotected portions of conductive sheet 120, etc.

Figure 4:
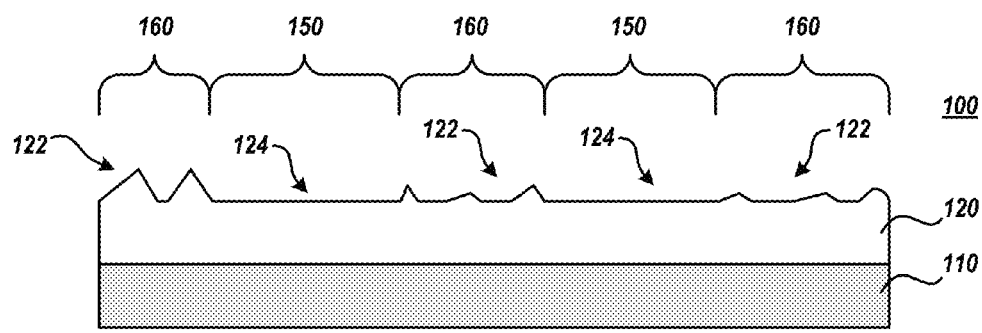

FIG. 4 depicts a cross sectional view of circuit apparatus 100 at an intermediate fabrication stage. At the present fabrication stage, mask 130 is removed.

Mask 130 may be removed by a stripping technique, such as a substantive etching technique, as is known in the art. Upon the removal of mask 130, conductive sheet 120 includes irregular surface 122 within a rough region 160 of circuit apparatus 100 and a planarized surface 124 within a smooth region 150 of circuit apparatus 100. Planarized surface 124 within smooth region 150 corresponds to portions of circuit apparatus 100 exposed or otherwise unprotected by mask 130. Irregular surface 122 within rough region 160 corresponds to portions of circuit apparatus 100 covered or otherwise protected by mask 130. Planarized surface 124 is generally flatter relative to irregular surface 122.

For clarity, circuit apparatus 100 may undergo further fabrication stages. Specifically, portions of the conductive sheet 120 may be etched to form circuit features. An etch mask may be formed upon the conductive sheet 120 and protects portions of the underlying conductive sheet 120 while other portions of the underlying conductive sheet 120 remain exposed. Those exposed portions of conductive sheet 120 may be removed by an etchant as is known in the art. The remaining or protected portions of conductive sheet 120 form one or more circuit features, such as, a signal trace, signal plane, power trace, power plane, etc. Since such circuit features are formed from conductive sheet 120, they has similar electrical properties relative to conductive sheet 120.

Figure 5A:
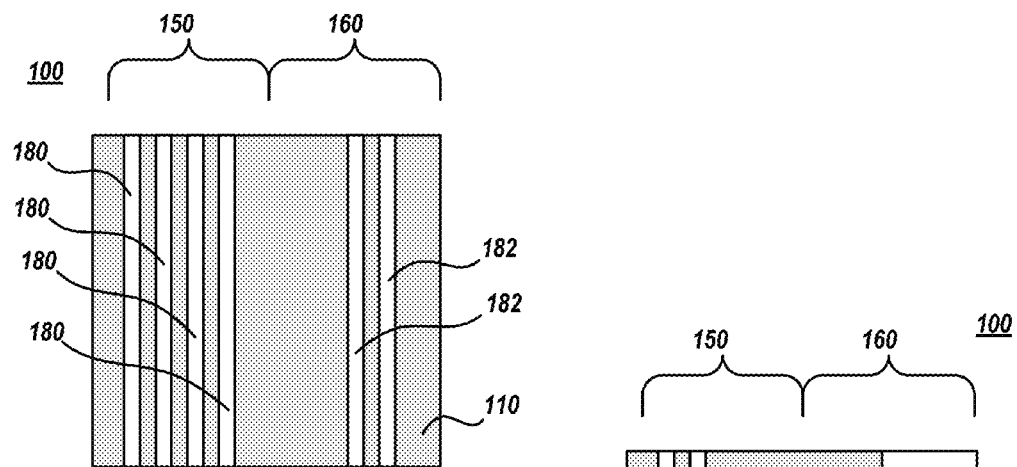
FIG. 5A, FIG. 5B, and FIG. 6 illustrate a top view of an exemplary circuit apparatus, according to various embodiments of the present invention.

FIG. 5A illustrates a top view of an exemplary circuit apparatus 100, according to various embodiments of the present invention. The exemplary circuit apparatus 100 includes high speed traces 180 and low speed traces 182. According to an embodiment, high speed traces 180 are located within smooth region 150 of circuit apparatus 100. In other words, high speed traces 180 each include a planarized surface 124 to improve signal integrity and reduce insertion loss. Because signal integrity is of lower priority when associated with low speed traces 182, low speed traces 182 may be located in rough region 160. In other words, low speed traces 182 each include an irregular surface 122 to improve adhesion between the irregular surface 122 and bonding material utilized to bond multiple layers of circuit apparatus 100 together.

Figure 5B:
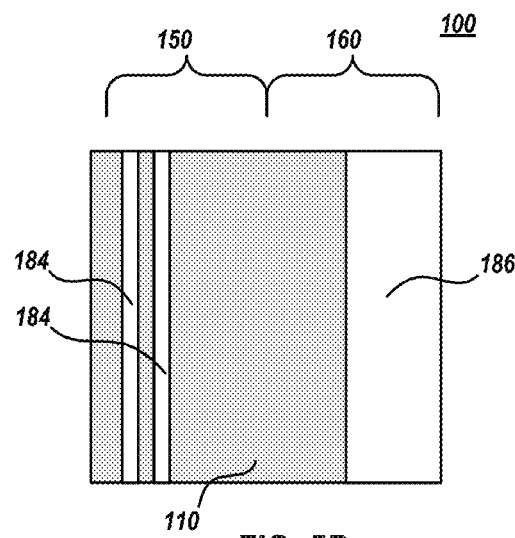

FIG. 5B illustrates a top view of an exemplary circuit apparatus 100, according to various embodiments of the present invention. The exemplary circuit apparatus 100 includes traces 184 and plane 186. Trace 184 may be signal trace electrically connected to a signal plane 186 (not shown). Trace 184 may be a signal trace electrically connected to a power plane 186. According to an embodiment, trace 184 may be located within smooth region 150 of circuit apparatus 100. In other words, trace 184 includes a planarized surface 124 to improve signal integrity and reduce insertion loss. Because signal integrity is of lower priority when associated with plane 186, plane 186 may be located in rough region 160. In other words, plane 186 includes an irregular surface 122 to improve adhesion between the plane 186 and bonding material utilized to bond multiple layers of circuit apparatus 100 together.

Figure 6:
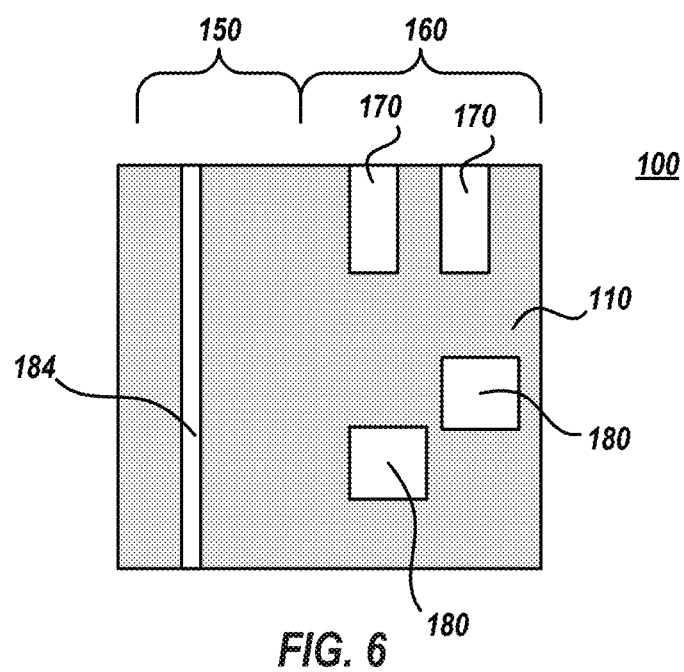

FIG. 6 illustrates a top view of an exemplary circuit apparatus 100, according to various embodiments of the present invention. The exemplary circuit apparatus 100 includes trace 184, surface mount region 170, and/or a connection via region 180. Surface mount region 170 is a region of circuit apparatus 100 where a surface mount device is electrically connected to the circuit apparatus 100. Connection via region 180 is a region of circuit apparatus 100 where respective circuit features 120' of different layers of the multilayered circuit apparatus 100 are electrically connected. For example, connection via region 180 may be a region where signal traces in multiple layers of the multilayered circuit apparatus 100 are electrically connected by a via.

According to an embodiment, trace 184 may be located within smooth region 150 of circuit apparatus 100. Because signal integrity is of lower priority when associated with surface mount region 170 and connection via region 180, surface mount region 170 and connection via region 180 may be located in rough region 160. More specifically, surface mount region 170 includes an irregular surface 122 surrounding a surface mount device to improve adhesion between the surface mount region 170 and bonding material utilized to bond multiple layers of circuit apparatus 100 together. Likewise, connection via region 180 includes an irregular surface 122 surrounding a via to improve adhesion between the connection via region 180 and bonding material utilized to bond multiple layers of circuit apparatus 100 together.

Figure 7:
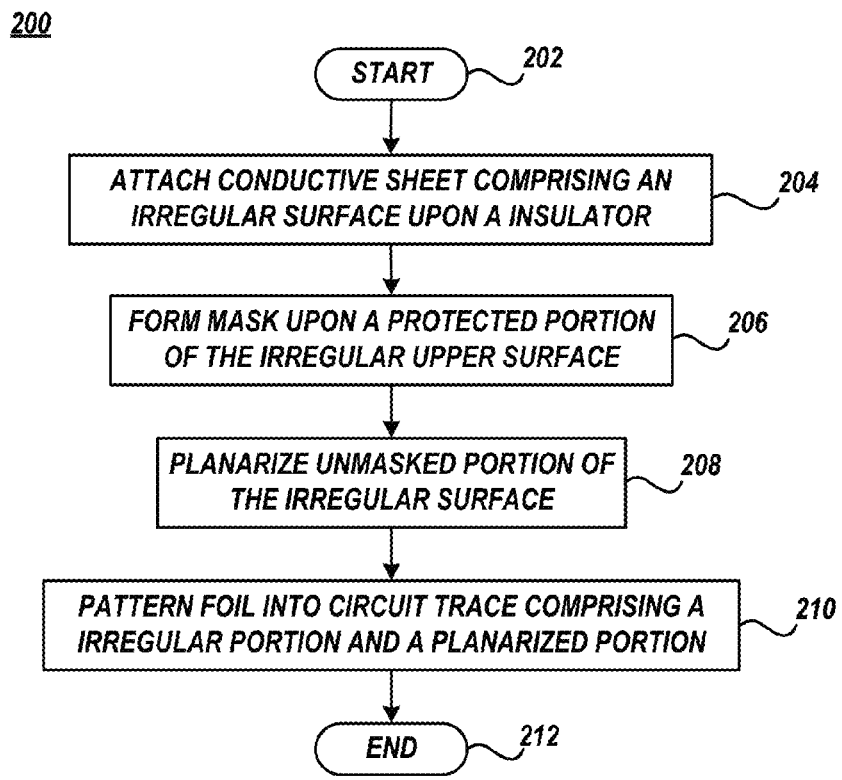
FIG. 7 illustrates an exemplary process for fabricating a reduced insertion loss circuit apparatus including at least one first circuit feature comprising an irregular surface and a planarized surface, according to various embodiments of the present invention.

FIG. 7 illustrates an exemplary process 200 for fabricating a reduced insertion loss circuit apparatus 100 including at least one circuit feature comprising an irregular surface 122 and a planarized surface 124. Process 200 may be utilized to fabricate a PCB, flex circuit, PCB core, flex circuit core, or the like.

Process 200 begins at block 202 and may continue with attaching a conductive sheet 120 comprising an irregular surface 122 to insulator 110 (block 204). For example, a copper foil may be laminated to an FR4 laminate.

Process 200 may continue with forming a mask 130 upon a protection portion of the irregular surface 122 (block 206). For example, a photoresist film may be applied to the irregular surface 122 and patterned. Portions of the photoresist film may be removed while other portions of the photoresist film remain upon the irregular surface. Those portions of irregular surface covered by the photoresist film are protection portions of the irregular surface 122. Those portions of irregular surface not covered by the photoresist film are exposed portions of the irregular surface 122.

Process 200 may continue with planarizing the exposed portion of the irregular surface 122 forming planarized surface 124 (block 208). For example, the exposed portion of the irregular surface 122 may be planarized by an electropolish technique. Geometrical irregularities of the irregular surface 122 are reduced forming planar surface 124 having relatively fewer geometrical irregularities. For clarity, at the present fabrication stage, the conductive sheet 120 includes the protection portion having the maintained the irregular surface 122 and a smooth portion including the planarized surface 124.

Process 200 may continue with patterning the conductive sheet 120 into at least one circuit feature (block 210). For example, an etch mask may be applied to the conductive sheet 120. Portions of the etch mask may be removed while other portions of the etch mask remain upon the conductive sheet 120. Those portions of conductive sheet 120 covered by the mask are protected from an etchant and the portions of conductive sheet 120 not covered by the etch mask are exposed to the etchant and removed. The etch mask is removed and those portions of conductive sheet 120 previously covered by the mask are maintained upon the insulator 110 and form the at least one circuit feature.

In an embodiment, the maintained conductive sheet 120 forms a single circuit feature, such as a single trace. In other words, a trace may be formed by the patterning the conductive sheet 120 such that the trace formed from the patterned conductive sheet 120 includes a first trace portion including an irregular surface 122 and a second trace portion including a planarized surface 124.

In another embodiment, the maintained conductive sheet 120 forms multiple circuit features. For example, a first circuit feature may be a signal trace and a second circuit feature may be a power plane, surface mount region, etc. The first circuit feature may include a planarized surface 124 and the second circuit feature may include an irregular surface 122, or vice versa. Process 200 ends at block 212.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:
1. A process of fabricating a flex circuit comprising:
attaching a conductive sheet to a first flexible insulator, the conductive sheet comprising an irregular surface opposed to the first flexible insulator;

forming a mask upon a protected portion of the irregular surface;

planarizing an unprotected portion of the irregular surface uncovered by the mask, and;

subsequent to planarizing the unprotected portion, patterning the conductive sheet into at least one circuit feature, the patterned conductive sheet comprising a maintained irregular surface and a planarized surface.

2. The process of claim 1, wherein planarizing the unprotected portion of the irregular surface further comprises:

electropolishing the unprotected portion of the irregular surface.

3. The process of claim 1, wherein patterning the conductive sheet into at least one circuit feature further comprises:

subtractive etching a first segment of the conductive sheet, and;

maintaining a second segment to form the at least one circuit feature.

4. The process of claim 1, wherein patterning the conductive sheet into at least one circuit feature further comprises:

forming a circuit trace comprising the planarized surface, and;

forming a power plane comprising the maintained irregular surface.

5. The process of claim 1, wherein patterning the conductive sheet into at least one circuit feature further comprises:

forming a high speed signal circuit trace comprising the planarized surface, and;

forming a low speed signal circuit trace comprising the maintained irregular surface.

6. The process of claim 1, wherein patterning the conductive sheet further comprises:

removing segments of the patterned conductive sheet exposing the underlying first insulator.

7. The process of claim 6, further comprising:

bonding a second insulator to the patterned conductive sheet and the exposed first insulator.

8. The process of claim 7, wherein the maintained irregular surface increases bonding between the patterned conductive sheet and the second insulator and wherein the planarized surface reduces insertion loss within the circuit apparatus.

* * * * *